Jan. 28, 1969 W. G. ANSLEY 3,423,823

METHOD FOR MAKING THIN DIAPHRAGMS

Filed Oct. 18, 1965 Sheet 1 of 2

INVENTOR
WILLIAM GENE ANSLEY
BY Q. C. Smith
ATTORNEY

INVENTOR
WILLIAM GENE ANSLEY
BY R. C. Smith
ATTORNEY

United States Patent Office 3,423,823

Patented Jan. 28, 1969

3,423,823

METHOD FOR MAKING THIN DIAPHRAGMS

William G. Ansley, Mountain View, Calif., assignor to Hewlett-Packard Company, Palo Alto, Calif., a corporation of California Filed Oct. 18, 1965, Ser. No. 497,006
U.S. Cl. 29—578 8 Claims
Int. Cl. H01l 3/12, 7/00

ABSTRACT OF THE DISCLOSURE

Channels are formed in one side of a silicon slice in a pattern defining a plurality of chips or diaphragms to be formed from the slice. The channels have a depth in excess of the desired thickness of the chips or diaphragms. A first oxide layer is formed along the same side of the slice and along the walls of the channels. A support layer of polycrystalline silicon is formed on this first oxide layer. Silicon is then removed from the other side of the slice to form gaps in the first oxide layer at the bottoms of the channels and to make the combined thickness of the first oxide layer and the slice equal to the desired thickness of the chips or diaphragms. Circuit components are then formed on this other side of the slice in the chips or diaphragms. The layer of polycrystalline silicon may then be etched to the depth of the first oxide layer and through the gaps in the first oxide layer to form separate chips of the desired thickness. Alternatively, a second oxide layer may be formed on the layer of polycrystalline silicon and provided with a pattern of gaps so that diaphragms having the desired thickness and having peripheral support lips may be formed by etching. The first and second oxide layers may also include additional gaps aligned so that the diaphragms may be etched apart at the same time they are etched to the desired thickness.

This invention relates to a method for making thin semiconductor chips, and more particularly to a method for making thin semiconductor diaphragms such as, for example, are used as the sensing elements of some pressure transducers.

It is very difficult to make thin semiconductor diaphragms of the order of one-half a mil or less in thickness without severe breakage losses during the fabrication process. In addition to this breakage problem it is also difficult to control the thickness of such diaphragms within close tolerances.

Accordingly, it is the principal object of this invention to provide a method for making thin semiconductor diaphragms of controlled thickness with less breakage.

Another object of this invention is to provide a method for batch fabricating a plurality of thin semiconductor diaphragms of controlled thickness.

A more general object of this invention is to provide a method for making thin semiconductor chips with minimal breakage.

In accordance with the illustrated embodiments of the method of this invention a first layer of etch-resistant material is formed on one side of a semiconductor slice, and a comparatively thick and adherent layer of etchable material is formed over this first layer of etch-resistant material. Semiconductor material is then removed from the opposite side of the semiconductor slice until the combined thickness of the slice and the first layer of etch-resistant material equals the desired thickness of the semiconductor chip being formed. Circuit elements are next formed in said opposite side of the semiconductor slice. If the desired thickness of the semiconductor chip being formed is sufficient to permit handling and use thereof for its intended application without undue breakage, the layer of etchable material is then removed by etching. However, if this is not the case, a second layer of etch-resistant material is formed on selected portions of the layer of etchable material according to a desired pattern, and the remaining portions only of the layer of etchable material are etched away to the depth of the first layer of etch-resistant material. In this manner a semiconductor chip is formed having the desired thickness and having thicker reinforcement elements spaced thereon according to the desired pattern. For batch fabrication of the semiconductor chips the first and second layers of etch-resistant material are provided with corresponding gaps spaced so that individual chips are etched apart at the same time they are etched to the desired thickness.

Figure 1:
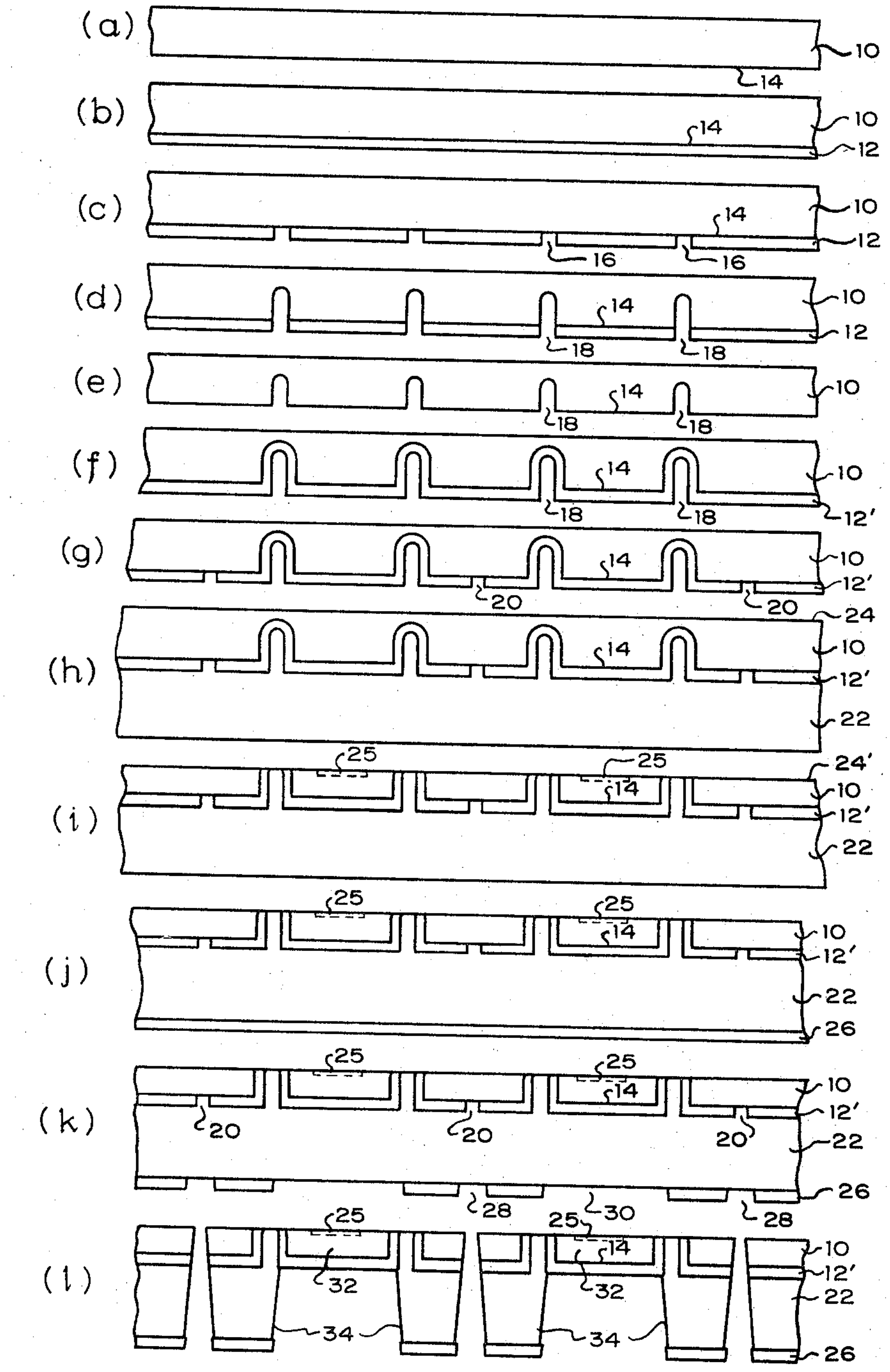
Figure 2:
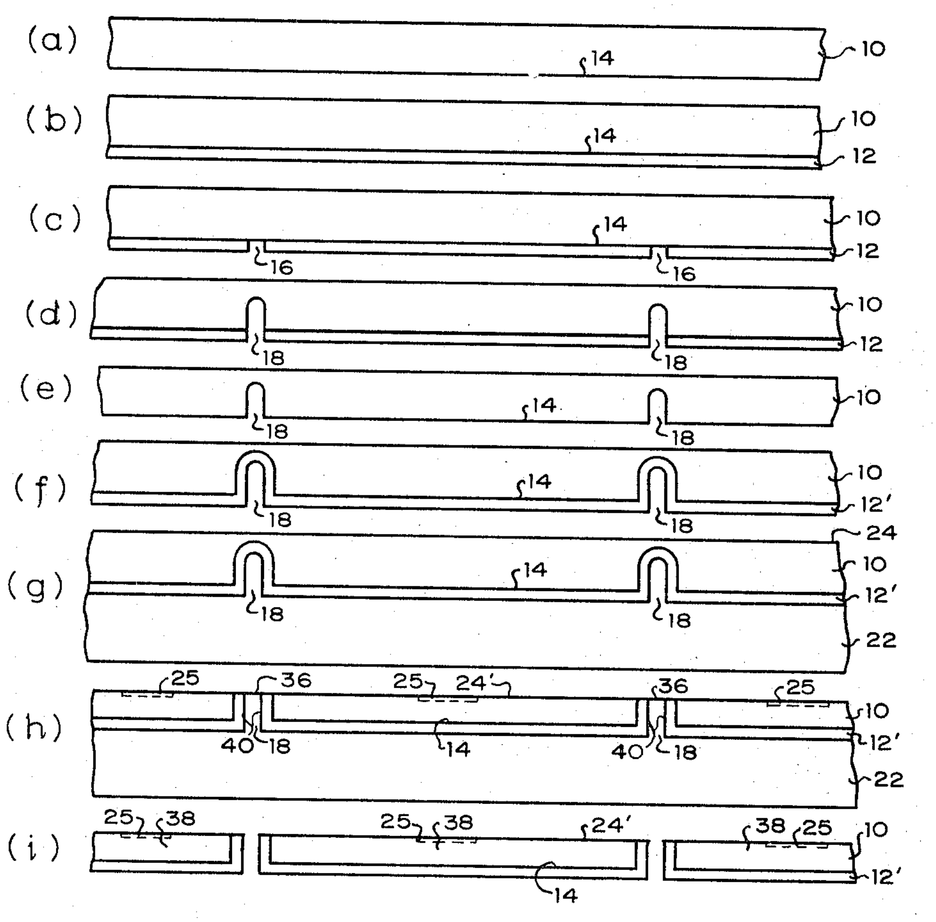

Other and incidental objects of this invention will become apparent from a reading of this specification and an inspection of the accompanying drawing in which:

FIGURE 1 is a diagram illustrating the successive steps of the method of this invention as it is used in the batch fabrication of semiconductor diaphragms; and FIGURE 2 is a diagram illustrating the successive steps of another embodiment of the method of this invention as it is used in the batch fabrication of thin semiconductor chips.

Referring to FIGURE 1*a*, there is shown a semiconductor slice 10 of single crystal silicon from which, for example, it is desired to make a plurality of thin, circular semiconductor diaphragms each having a thickness of about one half a mil. The first step in the batch fabrication of these diaphragms is to form a layer 12 of etch-resistant material on one side 14 of the semiconductor slice 10 as shown in FIGURE 1*b*. This may be done by oxidizing the semiconductor slice 10 to form a layer 12 of silicon dioxide thereon.

In order to provide for electrical isolation of the portions of the single crystal silicon slice 10 corresponding to different circular diaphragms, the second step in the batch fabrication of these circular diaphragms comprises removing selected portions of the etch-resistant layer 12 of silicon dioxide to form an annular gap 16 therein near the periphery of each of the circular diaphragms to be made from the semiconductor slice 10 as shown in FIGURE 1*c*. This pattern of gaps 16 may be formed by photo-etching or some other suitable process. The exposed portions of the single crystal silicon slice 10 are then etched, as shown in FIGURE 1*d*, to a depth in excess of the desired thickness of the diaphragms to form annular channels 18 therein corresponding to the gaps 16. The remaining portions of the etch-resistant layer 12 are next removed from the side 14 of the single crystal silicon slice 10, as shown in FIGURE 1*e*, and a new continuous etch-resistant layer 12' is formed thereon as shown in FIGURE 1*f*. This etch-resistant layer 12' may be formed by oxidation as described above. As an alternative procedure the etch-resistant layer 12' might simply be formed on top of the remaining portions of the etch-resistant layer 12. Selected portions of the etch-resistant layer 12' are then removed to form an annular gap 20 therein at the periphery of each of the circular diaphragms to be made from the semiconductor slice 10 as shown in FIGURE 1*g*. This gap pattern 20 may be formed in the etch-resistant layer 12' between the different diaphragms by photo-etching as described above. It should be noted that the second step of this method is not necessary when making a single semiconductor diaphragm.

The third step in making the diaphragms is to form a relatively thick (approximately three to eight mils) and adherent layer 22 of etchable material over the etch-resistant layer 12' as shown in FIGURE 1*h*. This etchable layer 22 may be formed by growing polycrystalline silicon over the etch-resistant layer 12' of silicon dioxide.

Having been reinforced by the thick layer 22 of polycrystalline silicon, the single crystal silicon slice 10 is now ready for the fourth step which comprises removing single crystal silicon from the side 24 thereof until the combined thickness of the silicon slice 10 and the etch-resistant layer 12' equals the desired thickness (about one-half a mil for this example) of the diaphragms as shown in FIGURE 1*i*. The single crystal silicon may be removed by lapping, polishing, etching, or any combination of these processes. Since in the second step the channels 18 were etched to a depth in excess of the desired thickness of the diaphragms, sufficient single crystal silicon is removed from the side 24 of the silicon slice 10 in this fourth step so that the etch-resistant layer 12' of silicon dioxide provides electrical isolation for portions of the silicon slice 10 corresponding to different circular diaphragms. At this point selected circuit elements 25 for each diaphragm may be formed in the new side 24' of the single crystal silicon slice 10 by standard semiconductor processing techniques as shown in FIGURE 1*i*.

The fifth step comprises forming another etch-resistant layer 26 over the layer 22 of polycrystalline silicon as shown in FIGURE 1*j*. This etch-resistant layer 26 may be formed by oxidation as described above. As shown in FIGURE 1*k*, selected portions of the etch-resistant layer 26 of silicon dioxide are then removed to form annular gaps 28 therein corresponding to the similar annular gaps 20 formed in the etch-resistant layer 12' during the second step and to form circular gaps 30 corresponding to the central portions of the diaphragms to be formed from the silicon slice 10. This gap pattern may be formed in the etch-resistant layer 26 by photo-etching, as described above, leaving only those portions of the etch-resistant layer 26 corresponding to the peripheral portions of the circular diaphragms to be formed from the silicon slice 10.

The sixth step comprises etching away the exposed portions of the etchable layer 22 of polycrystalline silicon to the etch-resistant layer 12' of silicon dioxide and thereby forming diaphragms 32 of the desired thickness each reinforced by a comparatively thick peripheral support lip 34 as shown in FIGURE 1*l*. Because of the gap pattern 20 in the etch-resistant layer 12' individual diaphragms 32 are etched apart and separated at the same time they are being etched to the desired thickness.

This method of batch fabricating semiconductor diaphragms 32 provides close control of diaphragm thickness since the etching is stopped automatically at the desired depth by the etch resistant layer 12'. In addition since many diaphragms 32 can be formed from one semiconductor slice by a single application of the method, it is possible to make almost identical diaphragms. It is apparent that thin semiconductor diaphragms 32 of almost any geometry may be made in accordance with this method by forming etch-resistant layers 12' and 26 with appropriate gap patterns.

Referring now to FIGURE 2, there is illustrated another embodiment of the method of this invention which is well suited to the batch fabrication of thin semiconductor chips. As shown in FIGURES 2*a–f* and explained in connection with the above-described first and second steps, annular channels 18 are formed in the side 14 of the semiconductor slice 10, and a continous layer 12' of etch-resistant material is then formed on the side 14. At this point, as shown in FIGURE 2*g*, the reinforcing layer 22 of etchable material is formed over the etch-resistant layer 12' as explained in connection with the above-described third step. Semiconductor material is next removed from the side 24 of the reinforced semiconductor slice 10 until the combined thickness of the semiconductor slice 10 and the etch-resistant layer 12' is equal to the desired thickness of the semiconductor chips being formed as shown in FIGURE 2*h*.

Selected circuit elements 25 for each semiconductor chip may then be formed in the new side 24' of the semiconductor slice 10 by standard semiconductor processing techniques. The annular channels 18 were etched to a depth in excess of the desired thickness of the semiconductor chips so that enough semiconductor material is removed from the side 24 of the semiconductor slice 10 to form gaps 36 in the annular portions of the layer 12' of etch-resistant material. Thus, subsequent etching separates the individual semiconductor chips 38 at the same time that it removes the layer 22 of etchable material, as shown in FIGURE 2*i*. The etch-resistant sidewalls 40 of the channels 18 formed by the etch-resistant layer 12' prevent lateral spreading after the etch reaches the side 24' of the semiconductor slice 10.

I claim:

1. A method of making a semiconductor element of controlled thickness from a slice of semiconductor material, said method comprising the steps of:
- forming a first layer of etch-resistant material on one side of said slice;
- forming an adherent layer of etchable material on said first layer of etch-resistant material;
- removing semiconductor material from the opposite side of said slice until the combined thickness of said slice and said first layer of etch-resistant material is equal to the desired thickness of the semiconductor element to be formed from said slice;
- forming a second layer of etch-resistant material on selected portions of said layer of etchable material; and
- etching remaining portions of said layer of etchable material to the depth of said first layer of etch-resistant material.

2. A method of making a semiconductor element of controlled thickness from a slice of semiconductor material, said method comprising the steps of:
- forming a first layer of etch-resistant material on one side of said slice, said first layer of etch-resistant material being thinner than the semiconductor element to be formed from said slice;
- forming an adherent layer of etchable material on said first layer of etch-resistant material, said layer of etchable material being at least as thick as the semiconductor element to be formed from said slice;
- removing semiconductor material from the opposite side of said slice until the combined thickness of said slice and said first layer of etch-resistant material is equal to the desired thickness of the semiconductor element to be formed from said slice;
- forming a circuit element in said opposite side of said slice;
- forming a second layer of etch-resistant material on selected portions of said layer of etchable material; and
- etching remaining portions of said layer of etchable material to the depth of said first layer of etch-resistant material.

3. A method of making a semiconductor element of controlled thickness from a slice of single crystal silicon, said method comprising the steps of:
- oxidizing said slice to form a first oxide layer on one side thereof, said first oxide layer being thinner than the semiconductor element to be formed from said slice;
- forming an adherent layer of etchable polycrystalline silicon on said first oxide layer, said layer of etchable polycrystalline silicon being at least as thick as the semiconductor element to be formed from said slice;

removing single crystal silicon from the opposite side of said slice until the combined thickness of said slice and said first oxide layer is equal to the desired thickness of the semiconductor element to be formed from said slice;

forming a circuit element in said opposite side of said slice;

oxidizing said layer of etchable polycrystalline silicon to form a second oxide layer on selected portions thereof; and etching remaining portions of said layer of etchable polycrystalline silicon to the depth of said first oxide layer.

4. A method of making a plurality of semiconductor elements of controlled thickness from a single slice of semiconductor material, said method comprising the steps of:

forming on one side of said slice a first etch-resistant layer having a first plurality of gaps therein defining portions of said slice corresponding to different ones of the semiconductor elements to be formed from said slice, said first etch-resistant layer being thinner than the semiconductor elements to be formed from said slice;

forming an adherent layer of etchable material on said first etch-resistant layer, said layer of etchable material being at least as thick as the semiconductor elements to be formed from said slice;

removing semiconductor material from the opposite side of said slice until the combined thickness of said slice and said first etch-resistant layer is equal to the desired thickness of the semiconductor elements to be formed from said slice;

forming a circuit element on said opposite side of said slice in each of the semiconductor elements to be formed from said slice;

forming on said layer of etchable material a second etch-resistant layer having a second plurality of gaps therein, some of said second plurality of gaps being disposed opposite said first plurality of gaps; and etching portions of said layer of etchable material exposed by said second plurality of gaps to the depth of said first etch-resistant layer and etching apart portions of said slice through said first plurality of gaps to form said semiconductor elements.

5. A method of making a plurality of semiconductor elements of controlled thickness from a single slice of semiconductor material, said method comprising the steps of:

forming on one side of said slice a first etch-resistant layer having a first plurality of gaps therein defining portions of said slice corresponding to different ones of the semiconductor elements to be formed from said slice, said first etch-resistant layer being thinner than said semiconductor elements and having sections that extend laterally therefrom to a depth in said slice in excess of the desired thickness of said semiconductor elements to provide electrical isolation between said semiconductor elements;

forming an adherent layer of etchable material on said first etch-resistant layer, said layer of etchable material being at least as thick as the semiconductor elements to be formed from said slice;

removing semiconductor material from the opposite side of said slice until the combined thickness of said slice and said first etch-resistant layer is equal to the desired thickness of the semiconductor elements to be formed from said slice;

forming a circuit element on said opposite side of said slice in each of the semiconductor elements to be formed from said slice;

forming on said layer of etchable material a second etch-resistant layer having a second plurality of gaps therein, some of said second plurality of gaps being disposed opposite said first plurality of gaps; and etching portions of said layer of etchable material exposed by said second plurality of gaps to the depth of said first etch-resistant layer and etching apart portions of said slice through said first plurality of gaps to form said semiconductor elements.

6. A method of making semiconductor chips of selected thickness from a slice of semiconductor material, said method comprising the steps of:

forming on one side of said slice an etch-resistant layer having a plurality of gaps therein defining portions of said slice corresponding to different ones of the chips to be formed from said slice;

forming an adherent layer of etchable material on said layer of etch-resistant material;

removing semiconductor material from the opposite side of said slice until the combined thickness of said slice and said layer of etch-resistant material is equal to said selected thickness; and etching said layer of etchable material to the depth of said layer of etch-resistant material and etching portions of said slice apart through said plurality of gaps to form said chips.

7. A method of making semiconductor chips of selected thickness from a slice of semiconductor material, said method comprising the steps of:

forming on one side of said slice an etch-resistant layer having a plurality of gaps therein defining portions of said slice corresponding to different ones of the chips to be formed from said slice;

forming an adherent layer of etchable material on said layer of etch-resistant material;

removing semiconductor material from the opposite side of said slice until the combined thickness of said slice and said layer of etch-resistant material is equal to said selected thickness;

forming a circuit element on said other side of said slice in each of the chips to be formed from said slice; and etching said layer of etchable material to the depth of said etch-resistant layer and etching portions of said slice apart through said plurality of gaps to form said chips.

8. A method of making semiconductor chips of selected thickness from a slice of semiconductor material, said method comprising the steps of:

forming on one side of said slice a plurality of channels that extend to a depth in said slice in excess of said selected thickness;

forming on said one side of said slice an etch-resistant layer having selected sections that extend laterally from said one side along the walls of said channels to a depth in excess of said selected thickness;

forming an adherent layer of etchable material on said layer of etch-resistant material and in said channels between said selected sections of said layer of etch-resistant material;

removing semiconductor material from the opposite side of said slice until the combined thickness of said slice and said layer of etch-resistant material is equal to said selected thickness and thereby forming gaps in said selected sections of said etch-resistant layer near the bottoms of said channels;

forming on said opposite side of said slice a circuit element in each of the chips to be formed from said slice; and etching said layer of etchable material to the depth of said etch-resistant layer and etching apart portions of said slice through said gaps in said selected sections of said etch-resistant layer, said selected sections of said etch-resistant layer preventing sideways etching of said portions of said slice while they are being etched apart through said gaps.

References Cited

UNITED STATES PATENTS

| | | | |
|---|---|---|---|
| 3,288,662 | 11/1966 | Weisberg. | |
| 3,290,753 | 12/1966 | Chang | 29—577 |
| 3,307,239 | 3/1967 | Lepselter et al. | 29—577 |
| 3,313,013 | 4/1967 | Last | 29—578 |

OTHER REFERENCES

I.B.M. Tech. Disc. Bull., vol. 3, No. 12, May 1961, pp. 26 and 27.

WILLIAM I. BROOKS, *Primary Examiner.*

U.S. Cl. X.R.

29—580; 156—17